United States Patent
Gao et al.

(10) Patent No.: US 10,225,957 B2
(45) Date of Patent: Mar. 5, 2019

(54) LIQUID COOLING FOR ELECTRONIC RACKS WITH LIQUID COOLED IT COMPONENTS IN DATA CENTERS

(71) Applicant: Baidu USA LLC, Sunnyvale, CA (US)

(72) Inventors: Tianyi Gao, Santa Clara, CA (US); Hu Tang, Shenzhen (CN); Yan Cui, San Jose, CA (US); Xianguang Tan, Shenzhen (CN); Zhiming Luo, Beijing (CN); Tianyu Zhou, Beijing (CN)

(73) Assignee: BAIDU USA LLC, Sunnyvale, CA (US)

( * ) Notice: Subject to any disclaimer, the term of this patent is extended or adjusted under 35 U.S.C. 154(b) by 28 days.

(21) Appl. No.: 15/548,382

(22) PCT Filed: Jul. 28, 2017

(86) PCT No.: PCT/CN2017/094914
§ 371 (c)(1),
(2) Date: Aug. 2, 2017

(65) Prior Publication Data
US 2019/0037730 A1    Jan. 31, 2019

(51) Int. Cl.
*H05K 7/20* (2006.01)
*G06F 1/16* (2006.01)

(52) U.S. Cl.
CPC ..... *H05K 7/20772* (2013.01); *H05K 7/20172* (2013.01); *H05K 7/20281* (2013.01)

(58) Field of Classification Search
CPC ........... H05K 7/20772; H05K 7/20172; H05K 7/20281

USPC ...... 361/679.53, 679.48, 679.49, 679.5, 690, 361/694, 695, 696; 165/80.2
See application file for complete search history.

(56) References Cited

U.S. PATENT DOCUMENTS

| | | | | |
|---|---|---|---|---|
| 6,747,872 B1 * | 6/2004 | Patel | ......... | G06F 1/20 361/695 |
| 6,868,682 B2 * | 3/2005 | Sharma | .......... | G01K 7/42 361/696 |
| 7,209,351 B2 * | 4/2007 | Wei | ......... | H05K 7/20745 361/695 |
| 7,500,911 B2 * | 3/2009 | Johnson | ......... | H05K 7/20836 165/104.33 |
| 7,542,287 B2 * | 6/2009 | Lewis, II | ........ | H05K 7/20736 361/695 |

(Continued)

FOREIGN PATENT DOCUMENTS

JP    2010164218 A * 7/2010 ......... H05K 7/20745

*Primary Examiner* — Anatoly Vortman
(74) *Attorney, Agent, or Firm* — Womble Bond Dickinson (US) LLP

(57) ABSTRACT

A data center liquid cooling coolant distribution system design for multiple liquid cooled racks which are arranged in multiple rows. These rows of electronic racks are positioned spaced apart from each other to form an aisle. The data center system further includes a CDU to provide cooling liquid to the electronic racks to remove heat generated from the IT components of the electronic racks. The CDU includes a set of liquid supply and return lines coupled to room manifolds arranged within the aisle. The room manifolds are coupled to rack manifolds of each electronic rack. The rack manifolds of an electronic rack are adapted to receive a cooling liquid from the CDU via the room manifolds and to exchange the heat generated from the IT components of the electronic rack.

20 Claims, 10 Drawing Sheets

(56) References Cited

U.S. PATENT DOCUMENTS

| | | | | |
|---|---|---|---|---|
| 8,184,436 B2* | 5/2012 | Campbell | H05K 7/20809 165/104.21 |
| 8,913,384 B2* | 12/2014 | David | H05K 13/00 361/679.53 |
| 8,947,879 B2* | 2/2015 | Broome | H05K 7/1497 165/104.33 |
| 9,635,785 B1* | 4/2017 | Heydari | H05K 7/20736 |
| 2003/0053293 A1* | 3/2003 | Beitelmal | G06F 1/206 361/679.49 |
| 2003/0067745 A1* | 4/2003 | Patel | H05K 7/20745 361/690 |
| 2004/0065097 A1* | 4/2004 | Bash | G05D 23/1931 62/180 |
| 2004/0090729 A1* | 5/2004 | Beitelmal | G06F 1/206 361/103 |
| 2004/0100770 A1* | 5/2004 | Chu | H05K 7/20754 361/698 |
| 2004/0217072 A1* | 11/2004 | Bash | H05K 7/20718 211/26 |
| 2005/0278069 A1* | 12/2005 | Bash | H05K 7/207 700/276 |
| 2006/0168975 A1* | 8/2006 | Malone | H05K 7/20836 62/180 |
| 2006/0199508 A1* | 9/2006 | Nair | F24F 11/0001 454/237 |
| 2008/0055846 A1* | 3/2008 | Clidaras | G06F 1/20 361/679.41 |
| 2008/0266794 A1* | 10/2008 | Malone | H05K 7/20745 361/695 |
| 2009/0056910 A1* | 3/2009 | Mallia | H05K 7/20754 165/80.3 |
| 2009/0059523 A1* | 3/2009 | Mallia | G06F 1/20 361/695 |
| 2009/0150133 A1* | 6/2009 | Archibald | G06F 17/5009 703/9 |
| 2012/0279233 A1* | 11/2012 | Chainer | H05K 7/20781 62/3.6 |
| 2015/0109728 A1* | 4/2015 | Campbell | H05K 7/20236 361/679.47 |

* cited by examiner

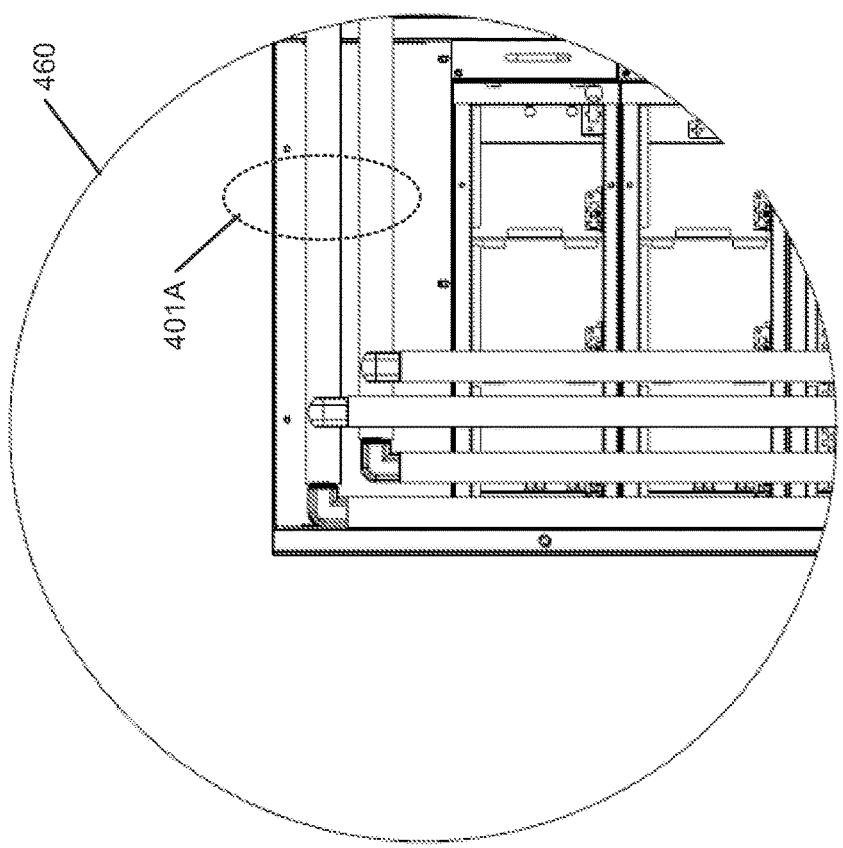

LIQUID COOLING FOR ELECTRONIC RACKS WITH LIQUID COOLED IT COMPONENTS IN DATA CENTERS

CROSS-REFERENCE TO RELATED APPLICATION

This patent application is a U.S. National Phase Application under 35 U.S.C. § 371 of International Application No. PCT/CN2017/094914. filed Jul. 28, 2017. entitled "A DESIGN OF LIQUID COOLING FOR ELECTRONIC RACKS WITH LIQUID COOLED IT COMPONENTS IN DATA CENTERS," which is incorporated by reference herein by its entirety.

FIELD OF THE INVENTION

Embodiments of the present invention relate generally to data centers. More particularly, embodiments of the invention relate to a liquid cooling system for electronic racks in data centers.

BACKGROUND

Heat removal is a prominent factor in computer system and data center design. The number of high performance electronics component such as high performance processors packaged inside servers has steadily increased, thereby increasing the amount of heat generated and dissipated during the ordinary operation of the servers. The reliability of servers used within a data center decreases if the environment in which they operate is permitted to increase in temperature over time. Maintaining a proper thermal environment is critical for normal operating of these servers in data centers, as well as the server performance and lifetime. It requires more effective and efficient heat removal solutions especially in the cases of cooling these high performance servers.

Liquid cooling for data centers has attracted a lot of attention. It offers many advantages and brings some potential benefits, such as energy efficiency improvement, infrastructure simplification, and compute performance enhancement and optimization. One important design for liquid cooling is the distribution system for delivering secondary loop heat transfer fluid to electronic racks. In some data center designs, hot aisles and cold aisles are separated and may be enclosed by an enclosure. Thus a frontend and a backend of an electronic rack is difficult to access for connecting the electronic rack with a liquid cooling system.

SUMMARY

Embodiments of the present disclosure provide a data center system and a data center facility.

In an aspect of the disclosure, the data center system comprises: a first row of electronic racks; a second row of electronic racks positioned spaced apart from the first row of electronic racks, forming an aisle between the first row and the second row of electronic racks; and a coolant distribution unit (CDU) having a first set of a liquid supply line and a liquid return line coupled to a set of room manifolds arranged within the aisle, wherein the room manifolds are coupled to a set of rack manifolds of each of the electronic racks of the first row and the second row, wherein the rack manifolds of each of the electronic racks are adapted to receive a cooling liquid from the CDU via the set of room manifolds, to exchange heat generated from one or more information technology (IT) components of the electronic racks using the cooling liquid, and to return a warmer liquid carrying the exchanged heat back to the CDU.

In another aspect of the disclosure, the data center facility, comprises: a facility cooling system coupled to a set of facility manifolds; and a plurality of data center system, each data center system comprises a first row of electronic racks, and a second row of electronic racks positioned spaced apart from the first row of electronic racks, forming an aisle between the first row and the second row of electronic racks; and a coolant distribution unit (CDU) having a first set and a second set of liquid supply lines and liquid return lines, wherein the first set of liquid supply line and liquid return line are coupled to the facility manifolds, wherein the second set of liquid supply line and the liquid return line are coupled to a set of room manifolds arranged within the aisle, wherein the room manifolds are coupled to a set of rack manifolds of each of the electronic racks of the first row and the second row, wherein the rack manifolds of each of the electronic racks are adapted to receive a cooling liquid from the CDU via the set of room manifolds, to exchange heat generated from one or more information technology (IT) components of the electronic racks using the cooling liquid, and to return a warmer liquid carrying the exchanged heat back to the CDU.

BRIEF DESCRIPTION OF THE DRAWINGS

Embodiments of the invention are illustrated by way of example and not limitation in the figures of the accompanying drawings in which like references indicate similar elements.

FIGS. 5A and 5B are block diagrams illustrating a cross view of a data center system according to one embodiment.

DETAILED DESCRIPTION

Figure 1:
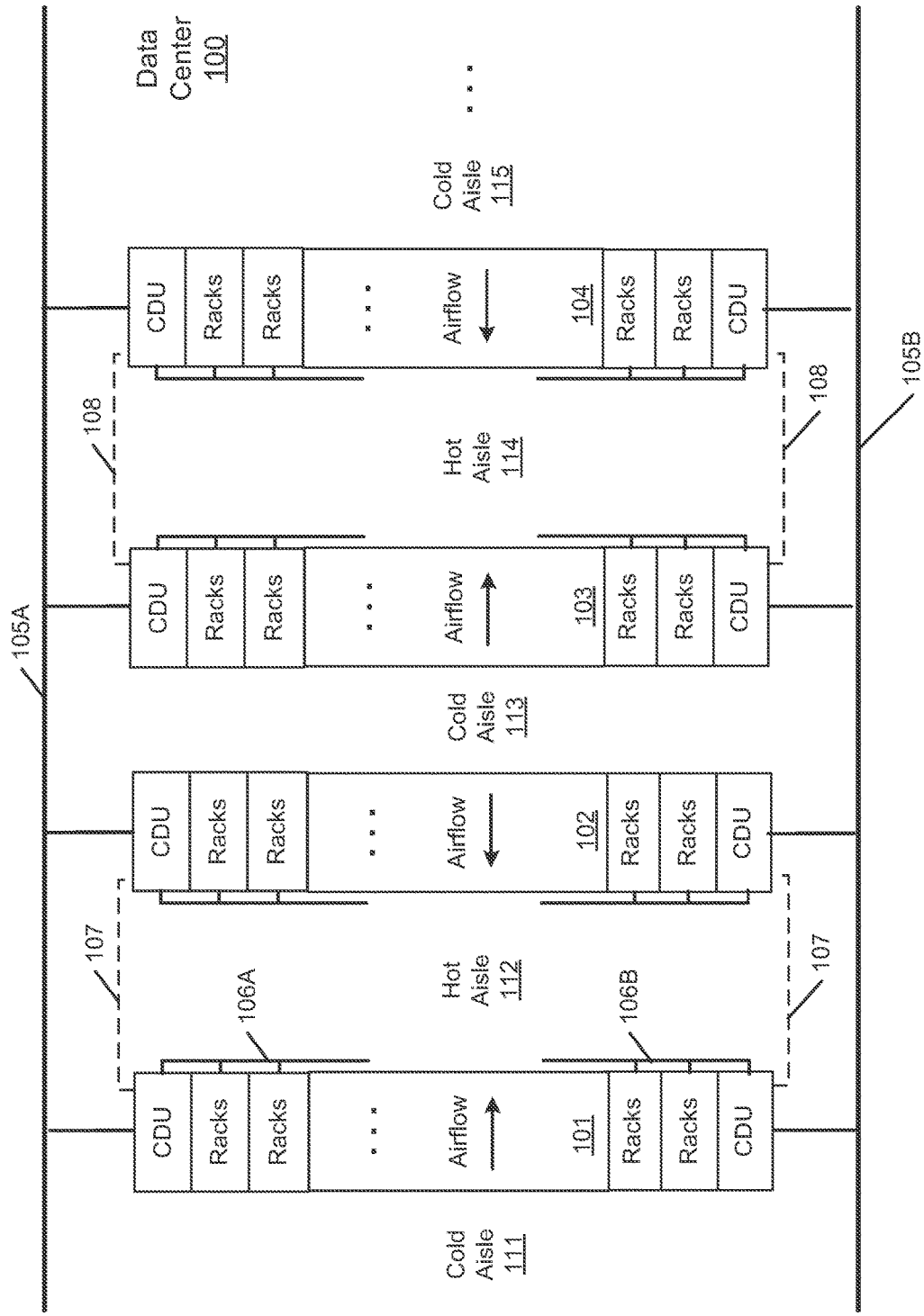
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention.

The appearances of the phrase "in one embodiment" in various places in the specification do not necessarily all refer to the same embodiment.

According to some embodiments, a room level liquid piping and distribution solution is provided to deliver and distribute cooling liquid to electronic racks. The design includes a heat transfer system from a facility liquid loop to the electronic racks within a data center room. The primary loop of a coolant distribution unit (CDU) is connected with the facility loop and the secondary loop of the CDU is arranged in a hot aisle, which may be contained within an enclosure or a room. A room level liquid distribution manifold (e.g., room level liquid supply line) receives cooling liquid from the CDU and distributes the cooling liquid to the electronic racks to exchange heat generated by the electronic racks. The return warm or hot liquid carrying the exchanged heat is returned to the CDU via the room level liquid distribution manifold (e.g., liquid return line).

The entire secondary liquid loop of the CDU or CDUs is disposed within a hot aisle between two rows of electronic racks. The secondary loop of the CDU is coupled to room level manifolds disposed within the hot aisle. The room level liquid manifolds are coupled to rack level liquid manifolds of the electronic racks on the backend of the electronic racks. Thus, the system is fully serviceable from the backend of the electronic racks. Unlike conventional systems, there is no liquid supply or return line disposed on the top of the electronic racks, the possibility of liquid leaking that may damage an electronic rack can be greatly reduced and the reliability of the system can be greatly improved.

According to one embodiment, a data center system includes a first row of electronic racks and a second row of electronic racks. Each of the electronic racks includes one or more information technology (IT) components, such as processors, memory, and/or storage devices. Some of the IT components may operate as a server to provide data services to a variety of clients. The first row of electronic racks and the second row of electronic racks are positioned spaced apart from each other to form an aisle in between (arranged in hot aisle and cold aisle fashion). The data center system further includes a CDU to provide cooling liquid to the electronic racks to remove heat generated from the IT components of the electronic racks. The CDU includes a set of liquid supply line and liquid return line coupled to a set of room manifolds that are arranged within the aisle, where the aisle may he enclosed within an enclosure or a room. The room manifolds are coupled to a set of rack manifolds of each of the electronic racks of the first and second rows. The rack manifolds of an electronic rack are adapted to receive a cooling liquid from the CDU via the room manifolds, to exchange the heat generated from the IT components of the electronic rack, and to return a warmer liquid carrying the exchanged heat back to the CDU via the room manifolds.

In one embodiment, each of the electronic racks of the first row and second row includes a frontend and a backend, The frontend allows a user to access the IT components. The rack manifolds are disposed on the backend of the electronic rack. The room manifolds are coupled to the rack manifolds via a set of connectors, such as dripless quick-release connectors. The backend of each electronic rack is positioned at the near side of the aisle, while the frontend of the electronic rack is positioned at the far side of the aisle. In other words, the backends of the electronic racks of the first row are facing the backends of the electronic racks of the second row across the aisle. The frontends of the electronic racks of the first row and the frontends of the electronic racks of the second row are facing away from each other. The frontends of the electronic rack may face to other frontends of the racks which are arranged in another pod/row.

In addition, a cooling airflow is generated from the frontend of each electronic rack, through an air space between the IT components therein to exchange at least a portion of the heat generated from the IT components, and to enter the aisle through the backend of the electronic rack as warmer air, in one embodiment, each electronic rack further includes one or more cooling fans mounted on the backend to generate an air flow by exhausting the air from the internal air space of the electronic rack. The aisle in this configuration is referred to as a hot aisle, while an aisle adjacent to the frontends of the electronic racks is referred to as a cold or cool aisle.

FIG. 1 is a block diagram illustrating an example of a data center facility according to one embodiment. Referring to FIG. 1, data center 100 includes a number of rows 101-104 of electronic racks. The rows 101-104 of electronic racks are arranged spaced apart from each other to form a number of aisles 111-115. In one embodiment, each of the electronic racks includes a frontend and a backend. The frontend allows a user to access the IT components contained therein, for example, for maintenance purpose such as upgrades, repairs, or replacements, etc. The backend of an electronic, rack includes certain connections coupled to other components of the data center facility 100, such as, for example, power connections, connections for cooling liquid supply and return lines, cooling fans, etc.

In one embodiment, for each of the rows 101-104 a cooling air flow is generated from a first aisle to flow from the frontends of the electronic racks towards the backends of the electronic racks across the air space between the IT components contained therein. The cooling air flow, when traveling the air space between the IT components, exchanges the heat generated from the IT components and transforms itself into a hot or warm air flow. The hot/warm air flow exits the electronic rack and enters a second aisle. An aisle between frontends of two rows of electronic racks is referred to as a cold or cool aisle, from which a cooling air flow is received. An aisle between backends of two rows of electronic racks is referred to as a hot or warm aisle, in which the hot/warm air is received.

For example, with respect to row 101 of electronic racks, a first cooling air flow is generated from aisle 111, flows through the air space between IT components of row 101 and enters aisle 112. Similarly, with respect to row 102 of electronic racks, a second cooling air flow is generated from aisle 113, flows through the air space between IT components of row 102, and enters aisle 112, Thus, aisles 111 and 113 are referred to as cold aisles, while aisle 112 is referred to as a hot aisle. For similar reasons, in this example, aisle 114 is referred to as a hot aisle and aisle 115 is referred to as a cold aisle. Thus, as shown in FIG. 1, the hot aisles and cold aisles are arranged in an alternating fashion. That is, a row of electronic racks is positioned between a hot aisle and a cold aisle, and a hot aisle is positioned between two cold aisles, or vice versa. In one embodiment, each of the electronic racks may include one or more cooling fans mounted on the backend of the electronic rack to generate an airflow flowing from the frontend towards the, backend of the electronic rack, That is, the cooling fans are mounted on a back side of the electronic rack adjacent to the corresponding hot aisle.

According to one embodiment, each of rows 101-104 of electronic racks is associated with one or more CDUs configured to provide cooling liquid to remove at least a portion of the heat generated from the corresponding electronic racks. A CDU can be positioned within a CDU slot of any of the electronic racks of the row. In this example, there two CDUs positioned at two ends of the row. However, a CDU can he positioned in any of the electronic racks in the row. A CDU can be positioned in a CDU slot within an electronic rack that also contains other IT components therein. For example, a CDU can be positioned at the top, middle, or bottom, any location of an electronic rack.

In one embodiment, each CDU includes a first set of manifolds (referred to as primary manifolds or facility side manifold), a heat exchanger, and a second set of manifolds (referred to as secondary manifolds), The primary manifolds of the CDU are coupled to a set of facility manifolds 105A-105B to form a primary loop. Facility manifolds 105A-105B are coupled to one or more facility cooling systems that produce cooling liquid (not shown). The secondary manifolds of the CDU are coupled to a set of room manifolds (also referred to as aisle manifolds), such as room manifolds 106A-106B of row 101, The room manifolds are coupled to rack manifolds of each of the electronic racks of the row. In this example, room manifolds 106A-106B are coupled to rack manifolds of each of the electronic racks of row 101. The rack manifolds distributes the cooling liquid to remove at least a portion of the heat generated from the IT components therein.

In one embodiment, some of the electronic racks may further includes a local CDU disposed within the electronic rack to provide cooling to the IT components within the corresponding electronic rack. Such a local CDU is referred to as a rack CDU. A CDU that provides cooling liquid to multiple electronic racks of a particular row is referred to as a room CDU (or an aisle CDU, a row CDU). The primary manifolds of a local CDU of an electronic rack are coupled to secondary manifolds of a room CDU, while the secondary manifolds of the local CDU are coupled to the rack manifolds of the electronic rack. In one embodiment, a rack CDU may also be used or delivering cooling liquid for multiple racks.

A set of manifolds described herein throughout this application includes a liquid supply line and a liquid return line. A liquid supply line is configured to supply cooling liquid from a cooling system to a heat producer (e.g., an IT component of an electronic rack, a heat exchanger of a CDU) to remove at least a portion of the heat generated by the heat producer, A liquid return line is configured to return hot or warm liquid carrying the heat exchanged from the heat producer to the cooling system. With respect to a CDU, a heat producer refers to the heat exchanger within the CDU and the cooling system refers to a cooling liquid producer coupled to the primary manifolds. With respect to an electronic rack, a heat producer refers to any of the IT components within the electronic rack and the cooling system refers to a CDU.

In one embodiment, all room manifolds are disposed within the hot aisles such as hot aisles 112 and 114. The room manifolds may be arranged along the backends of the electronic racks of each row and coupled to the rack manifolds that are disposed on the backends of the electronic racks. The room manifolds and the rack manifolds may be coupled to each other using quick-release connectors.

In one embodiment, each hot aisle is enclosed by an enclosure (or container, room) that contain any hot or warm air received as a part of airflows from the cold aisles. In this example, hot aisle 112 is enclosed is enclosure by enclosure 107. One or more exhaustion fans (not shown) can be deployed to exhaust the hot air out of the hot aisles, In one embodiment, each hot aisle is implemented in a form of a room having a number of slots or openings (e.g., windows, doors) on a wall of the room to receive the backends of the electronic racks. As a result, the backends of the electronic racks are exposed to within the hot aisle to allow a user to connect liquid manifolds with the rack manifolds and room manifolds. Rows 101-102 together with hot aisle enclosed by enclosure 107 may be referred to as a data center system or a data center unit, while rows 103-104 together with hot aisle 114 enclosed by enclosure 108 may he referred to another data center system or data center unit of data center facility 100.

Figure 2:
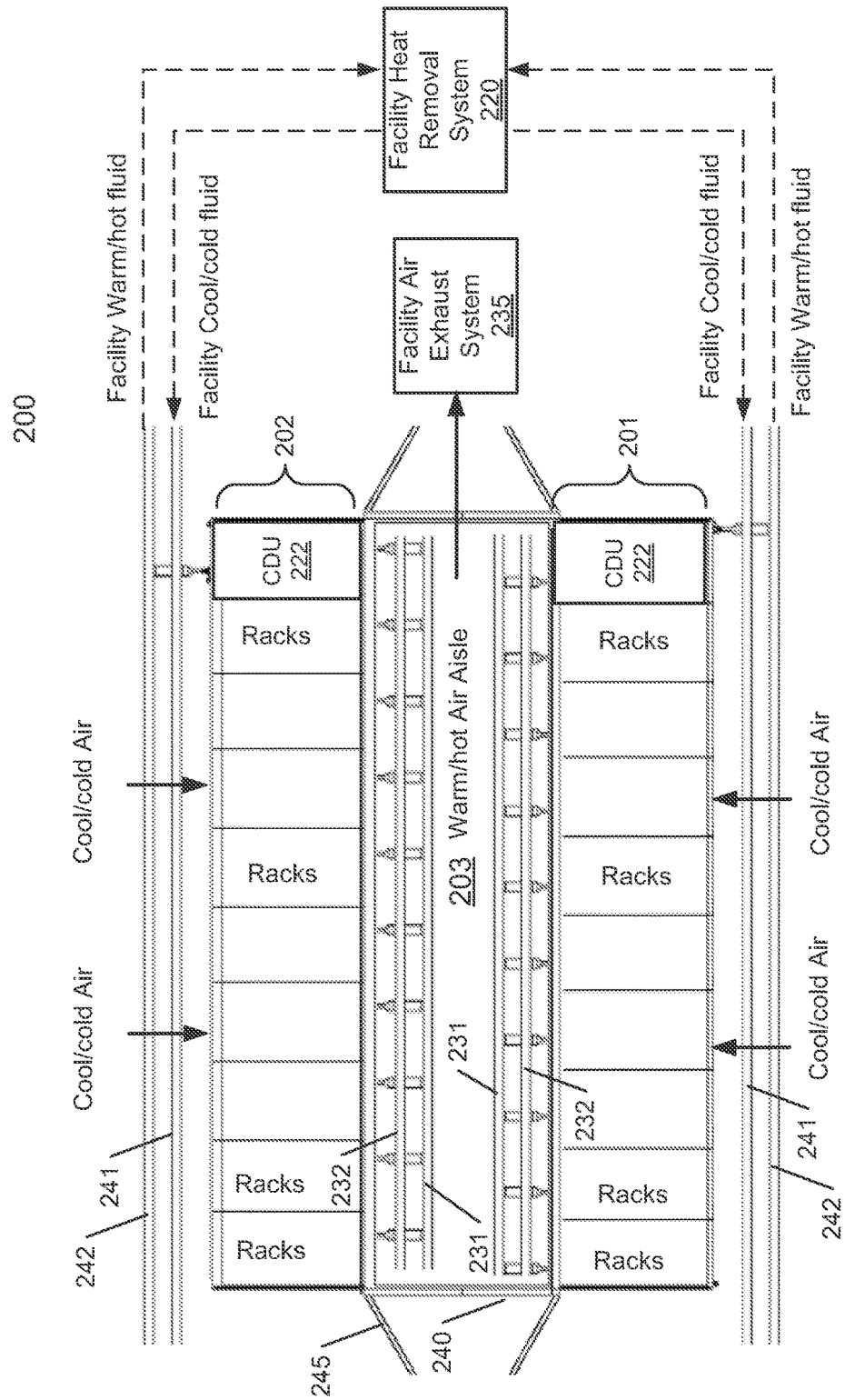
FIG. 2 is a block diagram illustrating a top view of a data center system according to one embodiment.

FIG. 2 is a block diagram illustrating a top view of a data center system according to one embodiment. Data center system 200 may represent any of the data center systems as shown in FIG. 1. Referring to FIG. 2, data center system 200 includes first row of electronic racks 201 and a second row of electronic racks 202 positioned apart from each other to form aisle 203 in between. in one embodiment, the frontends of the electronic racks of rows 201-202 are facing away from aisle 203 (e.g., far side with respect to aisle 203), while the backends of the electronic racks of rows 201-202 are facing each other across aisle 203 (e.g., near side with respect to aisle 203), in addition, an air flow is generated flowing from the frontends of the electronic racks, across the air space, between the IT components therein to exchange the heat generated from the IT components, to backends of the electronic racks to carry the exchanged heat, and entering aisle 203 as hot or warmer air. In one embodiment, each electronic rack further includes one or more fans mounted on the backend of the electronic rack to exhaust the warm air from the internal space of the electronic rack into aisle 203. Thus, aisle 203 is referred to as a hot/warm aisle, while the aisles adjacent to the frontends of the electronic racks are referred to as cold/cool aisles.

in addition, each of rows 201-202 includes one or more CDUs 222, which may be positioned as a part of an electronic rack. CDU 222 includes a first set of liquid manifolds coupled to facility manifolds 241-242, which are coupled to facility heat removal system 220 to form a primary loop. In this example, facility manifold 241 is a liquid supply line that provides cooling liquid from facility heat removal system 220. Facility manifold 242 is a liquid return line that transmits hot/warm liquid carrying the heat exchanged from the electronic racks back to facility heat removal system 220. In one embodiment, facility manifolds 241-242 may be disposed near a ceiling of housing and extend downwardly to connect with the CDUs.

CDU 222 further includes a second set of manifolds coupled to room or aisle manifold 231 (e.g., liquid return line) and room or aisle manifold 232 (e.g., liquid supply line) disposed within aisle 203 to form a secondary loop. Room manifolds 231-232 are then coupled to the rack manifolds of each of the electronic racks (not shown). The primary loop and the secondary loop of a CDU are configure to exchange heat using a liquid-to-liquid heat exchanger within the CDU. In one embodiment, the room manifolds 231-232 are coupled to the rack manifolds on the back panel of the electronic racks using a set of liquid connectors such as quick-release connectors. As a result, if there is any leaking of liquid, the liquid would not drop onto the IT components to cause damage.

According to one embodiment, the hot or warm air is removed from aisle 203 by exhausting the hot air out of aisle 203 using facility air exhaust system 233 such as fans. The hot air may be exhausted to outside of the data center housing that houses data center system 200, In a data center facility, there may be many sets of data center systems 200 housed within a data center facility housing. Facility heat removal system 220 may be coupled to each of the data center systems via facility manifolds such as facility manifolds 241-242.

Each electronic rack includes electronics (e.g.., servers or IT components such as processors, memory, and/or storage devices) that can be grouped into electronics being liquid cooled using CDUs 222 and electronics being air cooled (e.g., other components on the motherboard that are not feasible or impractical to be liquid cooled) using the cool air flows. Electronics being air cooled exchange heat with or dissipates heat via an air flow circulation system to remove the exchanged heat to an external environment or outside atmosphere, The electronics being liquid cooled exchange heat by cooling fluid. In one embodiment, the cooling fluid is circulated within a closed-loop fluid line, The cooling fluid carries exchanged heat from server IT components of electronics being liquid cooled through liquid cooling devices to a liquid-to-liquid heat exchanger (e.g., CDU 222). A liquid-to-liquid heat exchanger may thermally couple the cooling fluid to a second liquid line/facility loop to dissipate exchanged heat to an external cooling tower/dry tower/cooler such as facility heat removal system 220.

Electronics being air cooled exchange heat using a direct/indirect air heat exchanger. Direct air heat exchangers may include a direct free airflow from external environment into the data center budding to carry a heat load back outside of the external environment. An indirect air heat exchanger may include a closed-loop airflow thermally coupled a second airflow to exchange heat. In one embodiment, heat generated by electronics being air cooled includes heat generated from IT components of rack servers and/or heat transferred from liquid lines (both cold and hot liquid lines may transfer heat to the air, depending on the actual design and operating temperatures).

Referring back to FIG. 1, aisle 203 is enclosed by enclosure or room 240, which may include a set of doors such as door 245 to contain the hot air therein before being exhausted by air exhausted system 235. The enclosure can be implemented in a shape similar to a tunnel with doors disposed at both ends. The walls of the tunnel may include an array of opening (e.g., door or window) to receive the backends of the electronic racks, such that the backends of the electronic racks are exposed within the tunnel for maintenance purposes. The purpose of the enclosure is to contain the hot air to prevent the hot air circulated back to the cold aisles. The hot air is then removed from aisle 203 by air exhaust system 235 to outside of the data center. The set of doors allow a user to enter aisle 203 to perform any maintenance services of the electronic racks including, but are not limited to, connecting or disconnecting room manifolds 231-232 with or from rack manifolds of the electronic racks, connecting/disconnecting room manifolds 231-232 with/from CDUs 222, etc.

Figure 3:
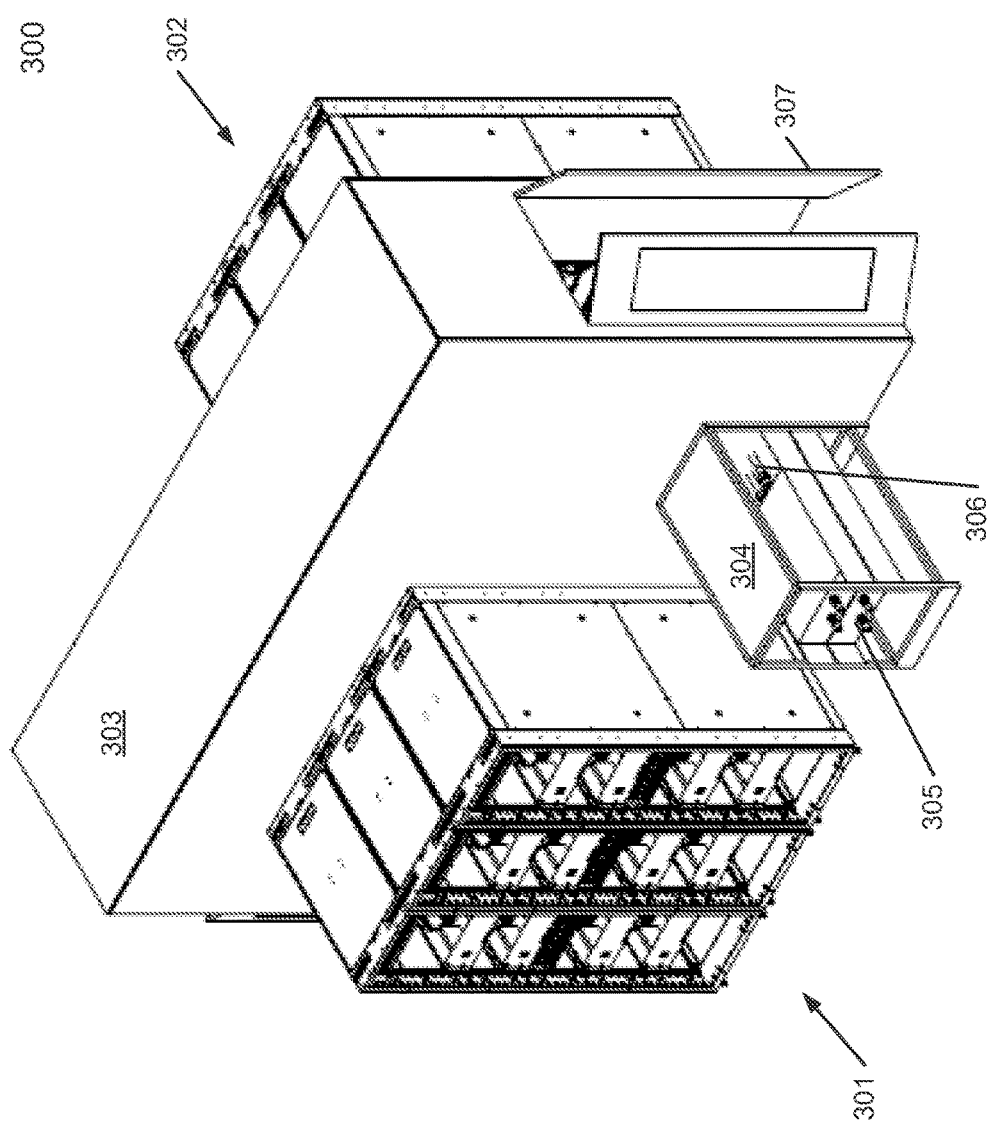
FIG. 3 is a block diagram illustrating a perspective view of a data center system according to one embodiment.

FIG. 3 is a block diagram illustrating a perspective view of a data center system according to one embodiment. Data center system 300 may be implemented as part of data center 200 of FIG. 2. Referring to FIG. 3, data center system 300 includes first row of electronic racks 301 and second row of electronic racks 302 positioned on a first side and a second side of aisle 303, respectively, where aisle 303 is sandwiched by rows 301-302. In this example, aisle 303 is an enclosed aisle enclosed by an enclosure or a room. The enclosure or the room includes at least one door 307 to allow a user to enter the aisle for maintenance and service purposes. Although there are three electronic racks for each of rows 301-302, more or fewer number of electronic racks may be implemented.

In one embodiment, each of rows 301-302 of electronic racks is associated with one or more CDUs, such as CDU rack 304. In this example, CDU rack 304 is implemented as a separate rack containing one or more CDUs disposed therein. However, a CDU may be positioned within a CDU slot of any of the electronic racks of rows 301-302. Although there are two CDUs contained in CDU rack 304 in this example, more or fewer number of CDUs can be included in CDU rack 304, The physical size and dimension of CDU rack 304 may be configured identical or similar to the size and dimension of an electronic rack of rows 301-302, such that CDU rack 304 can be inserted into any of the openings or rack slots of aisle 303 just like any of the electronic racks. As described above, each of the CDUs includes a first set of manifolds 305 to be coupled to a set of facility manifolds, which are coupled to a facility heat removal system such as heat removal system 220 of FIG. 2, forming a primary loop/facility loop. Each of the CDUs further includes a second set of manifolds 306 coupled to a set of room manifolds disposed within aisle 303 (not shown), forming a secondary loop.

According to one embodiment, the backends of the electronic racks of row 301 are positioned near a first wall of aisle 303, while their frontends are positioned away from aisle 303. Similarly, backends of electronic racks of row 302 are position near a second wall of aisle 303, while their frontends are positioned away from aisle 303. In one embodiment, each of the first and second walls of aisle 303 includes a number of openings (or doors or windows), also referred to as rack slots, each corresponding one of the electronic racks of rows 301-302. Each opening is configured to receive a backend of an electronic rack to allow the backend of the electronic rack to be exposed within aisle 303. Such a configuration allows a user to connect rack manifolds of the electronic racks with room manifolds disposed within aisle 303 (not shown). The rack manifolds are arranged on the backends (or back panels) of the electronic racks for easy access.

In one embodiment, a cooling air flow is generated that flows from the frontends of the electronic racks of rows 301-302, traveling through the air space between the IT components within the electronic racks, exiting the backends of the electronic racks, and entering into aisle 303 as a hot/warm air flow carrying the heat exchanged from the IT components. As a result, aisle 303 is a hot/warm aisle. The enclosure of aisle 303 contains the hot/warm air therein to prevent the hot/warm air recirculated back to the frontends of the electronic racks (e.g., cold aisles). in one embodiment, each of the electronic racks of rows 301-302 includes one or more cooling fans mounted on the backends of the electronic racks to exhaust the air out from the internal space of the electronic racks. A facility air exhaust system (e.g., air exhaust system 235) is configured to exhaust the hot/warm air out of the enclosed aisle 303, for example, via a dedicated hot/warm air tunnel to transport the hot/warm outside of the data center system or to a heat exchanger.

Figure 4A:
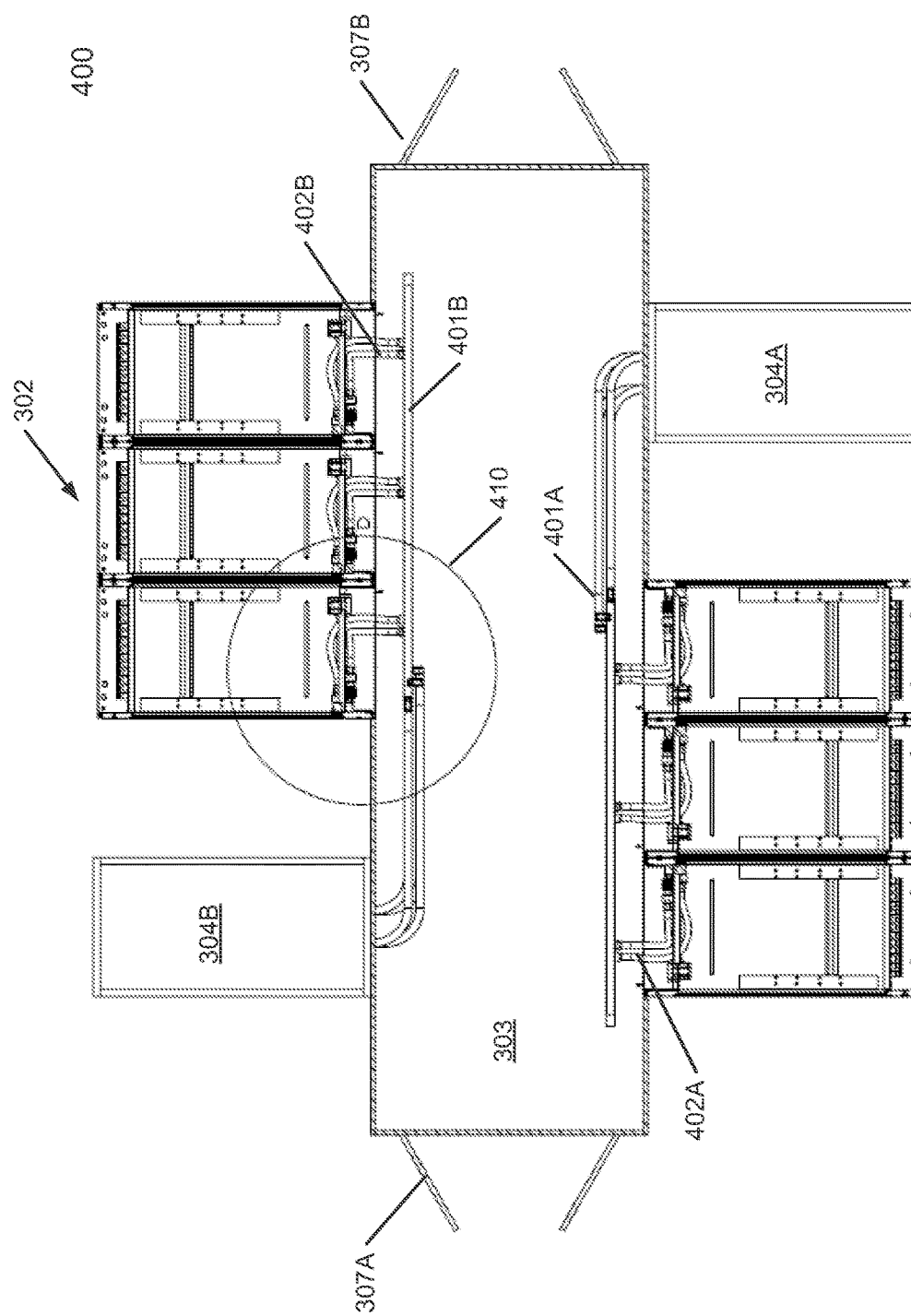
FIGS. 4A and 4B are block diagrams illustrating a top view of a data center system according to one embodiment.
Figure 4B:
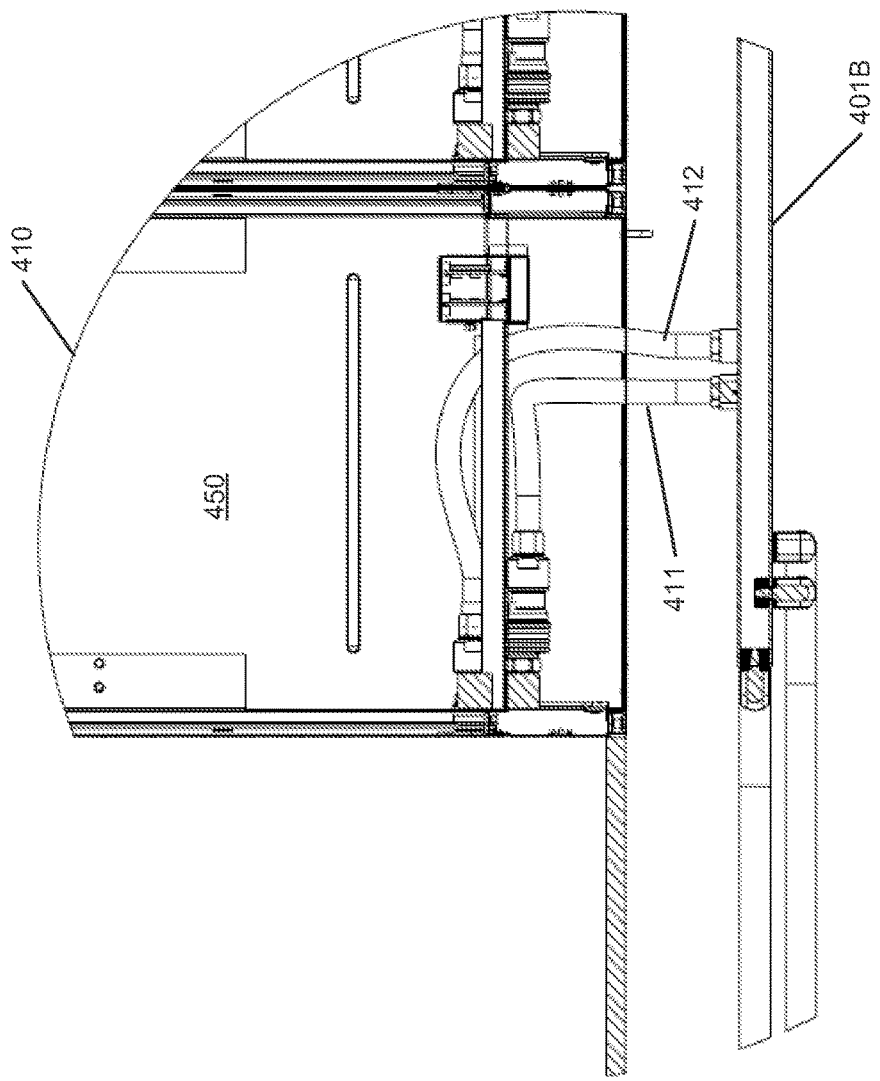

FIGS. 4A and 4B are block diagrams illustrating a top view of a data center system according to one embodiment. Data center system 400 may represent a top view of data center 300 of FIG. 3. Referring to FIG. 4A, row of electronic racks 301 are positioned on a first side of aisle 303, while row of electronic racks 302 are positioned on a second side of aisle 303. The backends of the electronic racks of rows 301-302 are facing each other across aisle 303. In addition, one or more CDUs, in this example, CDU racks 304A-304B are associated with rows 301-302 respectively. In this example, CDU racks 304A-304B are configured to have the same or similar size and dimension of any of the electronic racks of rows 301-302.

A set of manifolds of each CDU (e.g., secondary set of manifolds) is coupled to a set of room manifolds 401A-401B. In this example, the manifolds of CDU rack 304A are coupled to room manifolds 401A, while the manifolds of CDU rack 304B are coupled to room manifolds 401B, Note that room manifolds 401A-401B may be implemented as the same manifolds coupled to a single CDU. All of the room manifolds 401A-401B are arranged within aisle 303. In addition, each of the electronic racks includes a set of rack manifolds, such as rack manifolds 402A-402B, disposed on the backend of the electronic rack. The rack manifolds are coupled to room manifolds 401A-401B for example, using dripless quick-release connectors.

Referring now to FIG. 4B, which represents an enlarged portion 410 of a connecting area of electronic rack 450. In this example, the rack manifold includes liquid supply line 411 and liquid return line 412 coupled to room manifolds 401B. Liquid supply line 411 and liquid return line 412 may be implemented using flexible tubes for easy connections. The rack manifolds are then coupled to a slot liquid distribution loop (not shown) disposed in each of the slots within electronic rack 450 to distribute the cooling liquid to the IT components of the slot (not shown) and to return the hot/warm liquid carrying the heat exchanged from the IT components back to the room manifolds 401B. For example, the liquid distribution loop may be implemented in a form of flexible tube attached to or embedded within a liquid cooling device, where the liquid cooling device is then attached to a heat producer (e.g., IT component such as a processor). The cold liquid enters at a liquid supply end of the loop, loops through the distribution tube attached to the liquid cooling device to exchange heat, and then comes out from a liquid return end of the loop and back to the rack manifold.

Figure 5A:
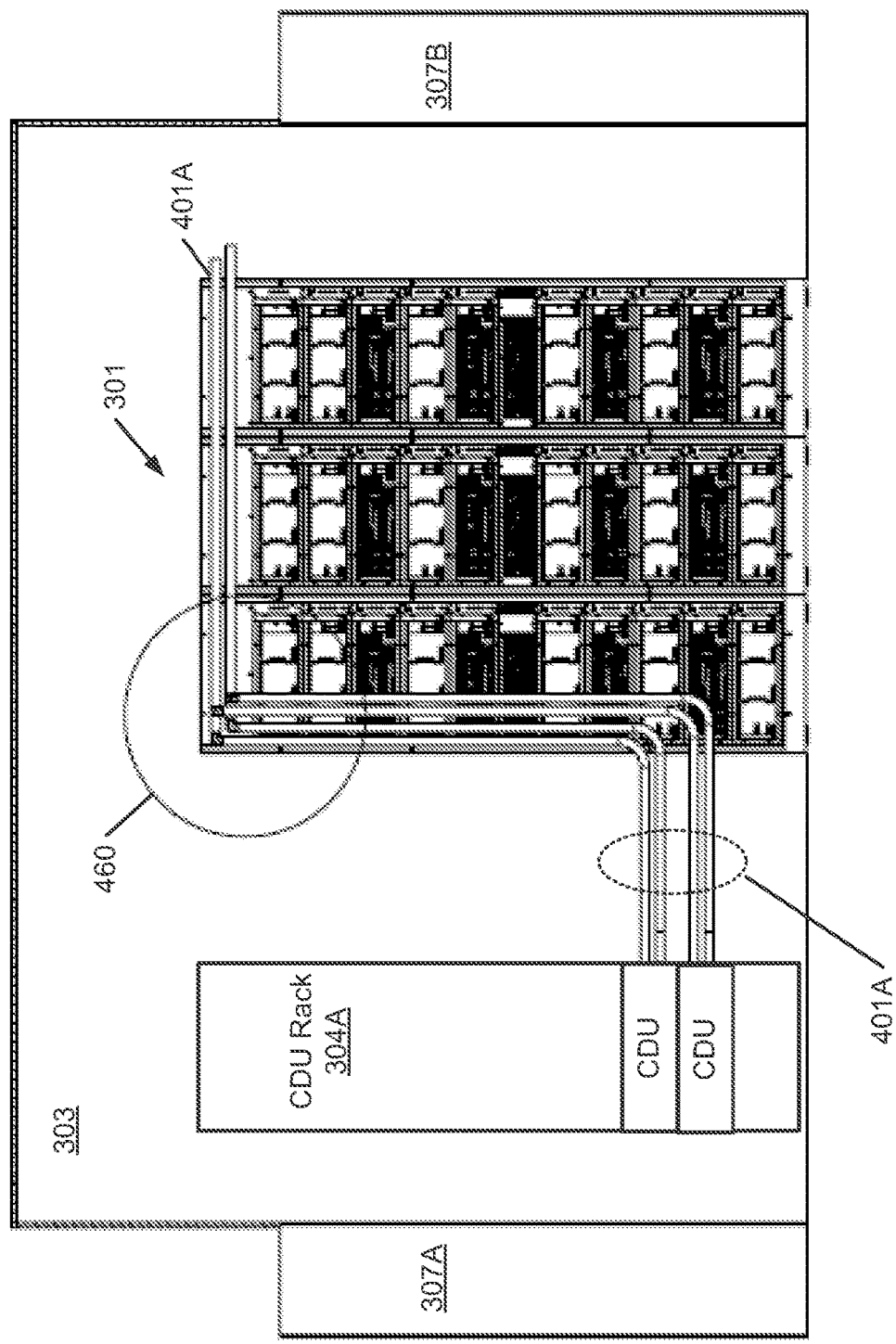

FIGS. 5A and 5B are block diagrams illustrating a cross view of a data center system according to one embodiment, The cross view as shown may represent a cross view of FIGS. 4A-4B. Referring to FIG. 5A, in this example, the cross view is projected from inside of aisle 303 towards the backends of the electronic racks 301. An enlarged portion 460 is shown in FIG. 5B. One or more CDUs of CDU rack 304A are coupled to one or more sets of room manifolds 401A, which are arranged across the backends of electronic racks 301. The rack manifolds of each electronic rack are then coupled to room manifolds 401A, for example, using dripless quick-release connectors.

Figure 6:
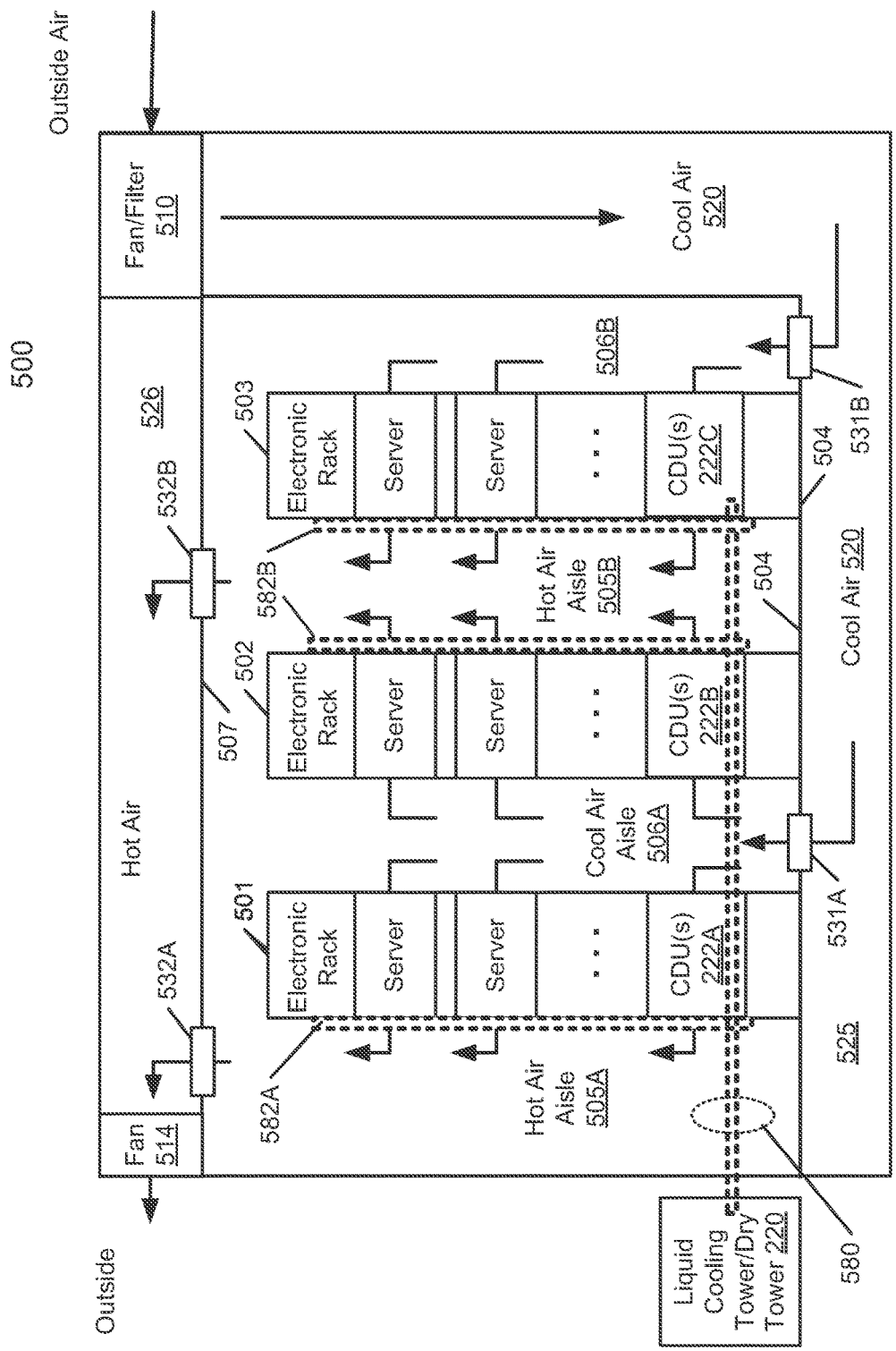
FIG. 6 is a block diagram illustrating a data center system according to another embodiment.

FIG. 6 is a block diagram illustrating a data center system according to another embodiment. In this example, a cross-section view or side view of a data center system is shown. Data center 500 may be implemented as a part of data center 100 of FIG. 1. Referring to FIG. 6, data center system 500 includes a housing structure, such as a room or a container, to house rows of electronic racks of IT equipment or instruments 501-503, in this example, computer servers that provide data services. Although only three rows of racks 501-503 are shown, more or fewer rows may be applied. The rows of electronic racks 501-503 are arranged in such a way to form aisles between every two rows, including hot air aisles 505A-505B and cool air aisles 506A-506B in this example.

In one embodiment, each row of electronic racks includes at least one CDU 222, such as CDUs 222A-222C. Each CDU includes a first set of liquid supply and return lines coupled to a set of facility manifolds 580 (represented by dash lines in the horizontal orientation), which are coupled to a facility heat removal system such as liquid cooling tower 220, forming a primary loop. Each CDU further includes a second set of liquid supply and return lines coupled to room/aisle manifolds disposed within the hot aisles such as hot aisles 505A-505B, such as rack manifolds 582A-582B, and represented by dash lines in the vertical orientation, forming a secondary loop.

In one embodiment, data center system 500 further includes fan/filter unit 510 (also referred to as an air supply system for the data center system). Unit 510 may also include humidification or dehumidification unit which is not shown in the figure. Air supply system 510 is configured to take in or draw fresh, possibly polluted, and non-conditioned air, also referred to as outside air, from an external environment into the housing of the data center system. Air supply system 510 may include one or more intake fans to draw in the outside air and optional one or more air filters, moisturizers, and/or dehumidifiers to filter, moisturize, and/or dehumidify the outside air, generating filtered air. The filters may reduce a portion of the particles or pollutants in the outside air.

According to one embodiment, data center system 500 further includes an airflow delivery system configured to generate one or more airflows based on cool air 520 to deliver the airflows of cool air 520 to cool the rows of electronic racks 501-503. In this example, the airflow delivery system includes a first channel (or tunnel or airspace) 525 to deliver cool air 520 into the housing that houses the rows of electronic racks 501-503. In one embodiment, first channel 525 may include one or more air ducts disposed underneath the floor or surface 504 (e.g., raised floor) that supports the rows of electronic racks 501-503. Multiple inlet pons (e.g., perforated tiles) 531A-531B may be disposed on various locations of floor 504 to allow the airflow of the cool air 520 to flow into the housing. In one embodiment, cool air 520 may directly be supplied to the raised floor.

In one embodiment, the inlet ports 531A-531B are arranged and disposed within proximity or at the bottom of cool air aisles 506A-506B of floor 504. Optionally, a fan or fans may be mounted on at least some of the inlet ports 531A-531B to draw or take in the coot air 520 from channel 525 upwardly into cool air aisles 506A-506B. For example, cool air is drawn from cool aisle 506A to hot air aisle 505A, traveling through the servers of row 501. Due to the heat exchange, the airflow flowing into hot air aisle 505A has a temperature higher than the temperature of the airflow received in cool air aisle 506A.

According to one embodiment, ceiling 507 of the housing includes one or more outlet ports (opening or windows) 532A-532B disposed within a proximity or on top of hot air aisles 505A-505B to allow the hot or warm air to be exhausted upwardly into second channel or tunnel or airspace 526, which will be directed to the external environment via fan 514. A fan may be optionally disposed or mounted on at least some of outlets 532A-532B to exhaust the hot or warm air from hot air aisles 505A-505B into tunnel 526. The cold/cool aisles 506A-506B and hot air aisles 505A-505B are configured in an alternate manner with respect to rows of electronic racks 501-503. In one embodiment, rows of electronic racks 501-503 are arranged in a specific configuration in which each row is sandwiched between a cool air aisle and a hot air aisle. The rows of electronic racks 501-503 are arranged in such a way that most of the cool air 520 will flow through the servers of the electronic racks 501-503 from cool air aisles 506A-506B to hot air aisles 505A-505B respectively. In this embodiment, cooler air is drawn from one side of the data center system 500 and warmer air is exhausted back to the outside environment from other side of the data center system 500.

Note that the configuration of data center system 500 as shown in FIG. 6 is illustrated and described for the purpose of illustration only. Other configurations or layouts of the components may also he applied. Air supply system 510 may be located in a variety of locations with respect to the housing of data center system 500. For example, air supply system 510 may be located external to the housing (e.g., on the floor or from a remote or distant location) and the cool air 520 may be delivered through a pipe/air duet coupled to channel 525. Air supply system 510 may be located from a side wall of the data center.

Figure 7:
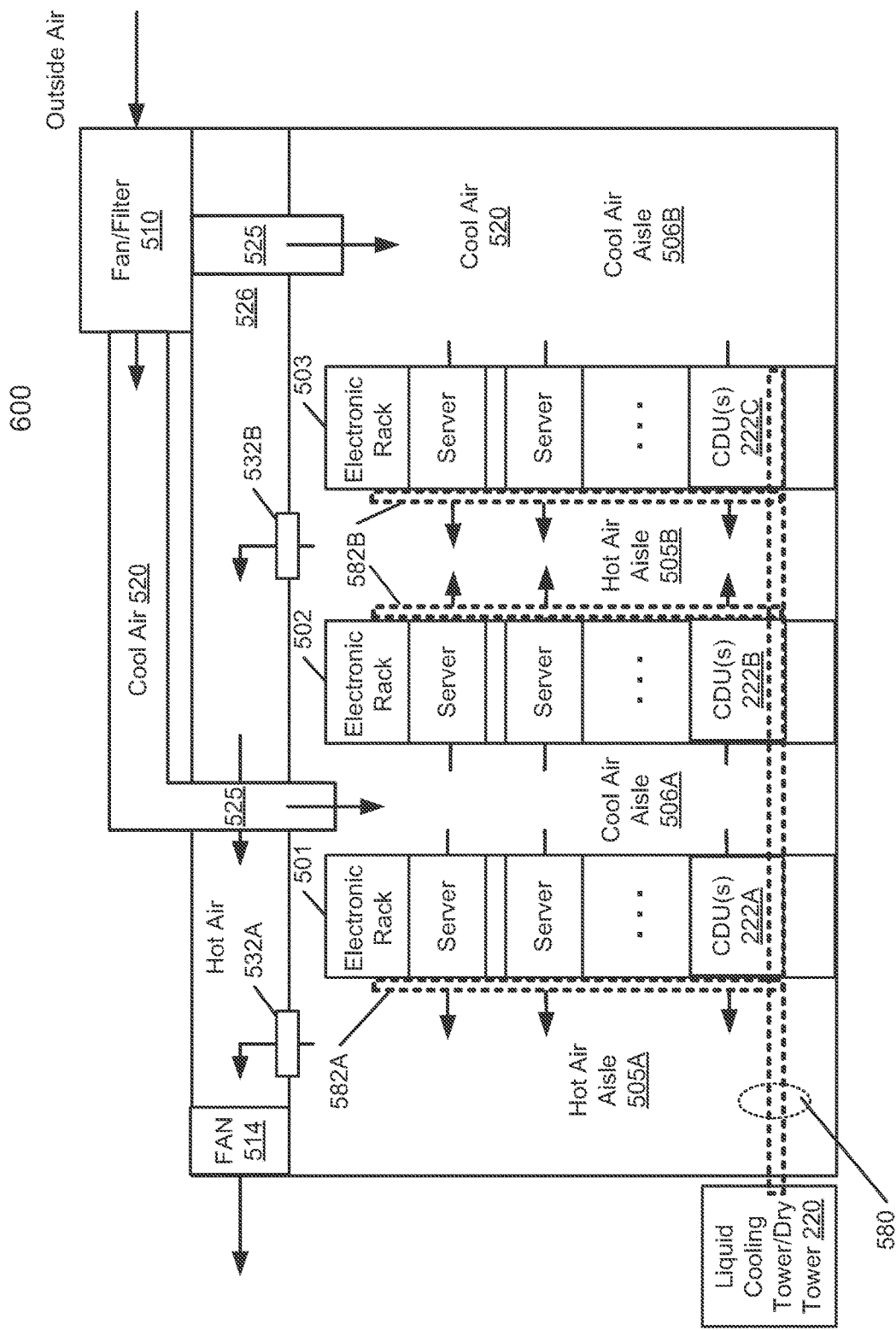
FIG. 7 is a block diagram illustrating a data center system according to another embodiment.

FIG. 7 is a block diagram illustrating a data center system according to another embodiment. Referring to FIG. 7, in this example, data center includes a liquid cooling system similar to liquid cooling system of FIG. 6. The data center 600 includes an air delivery system that includes a first channel (or tunnel or airspace) 525 above a ceiling of the container/housing to deliver cool air 520 into the housing that houses the rows of electronic racks 501-503. The first channel 525 may include one or more pipes or tubes forming air ducts disposed above the ceiling of the container/housing. Multiple inlet ports may be disposed on various locations of the ceiling to allow the airflow of the cool air 520 to flow into the housing.

In one embodiment, the ceiling of the housing includes one or more outlet ports (opening or windows) disposed within the proximity or on top of hot air aisles 505A-505B to allow the hot or warm air to be exhausted upwardly into second channel (or tunnel or airspace) 526, which will be directed to the external environment via fan 514. The first and second airspaces are separate airspaces, for example, the first and second airspaces may be separated by an air duct. A fan may be optionally disposed or mounted on at least some of outlets 532A-532B to exhaust the hoi or warm air from hot air aisles 505A-505B into tunnel 526. The cool air aisles 506A-506B and hot air aisles 505A-505B are configured in an alternate manner with respect to rows of electronic racks 501-503. In one embodiment, rows of electronic racks 501-503 are arranged in a specific configuration in which each row is sandwiched between a cool air aisle and a hot air aisle. The rows of electronic racks 501-503 are arranged in such a way that most of the cool air 520 will flow through the servers of the electronic racks 501-503 from cool air aisles 506A-506B to hot air aisles 505A-505B respectively. In addition, a liquid cooling system is deployed in the data center similar to the liquid cooling configuration as shown in FIG. 6.

Figure 8:
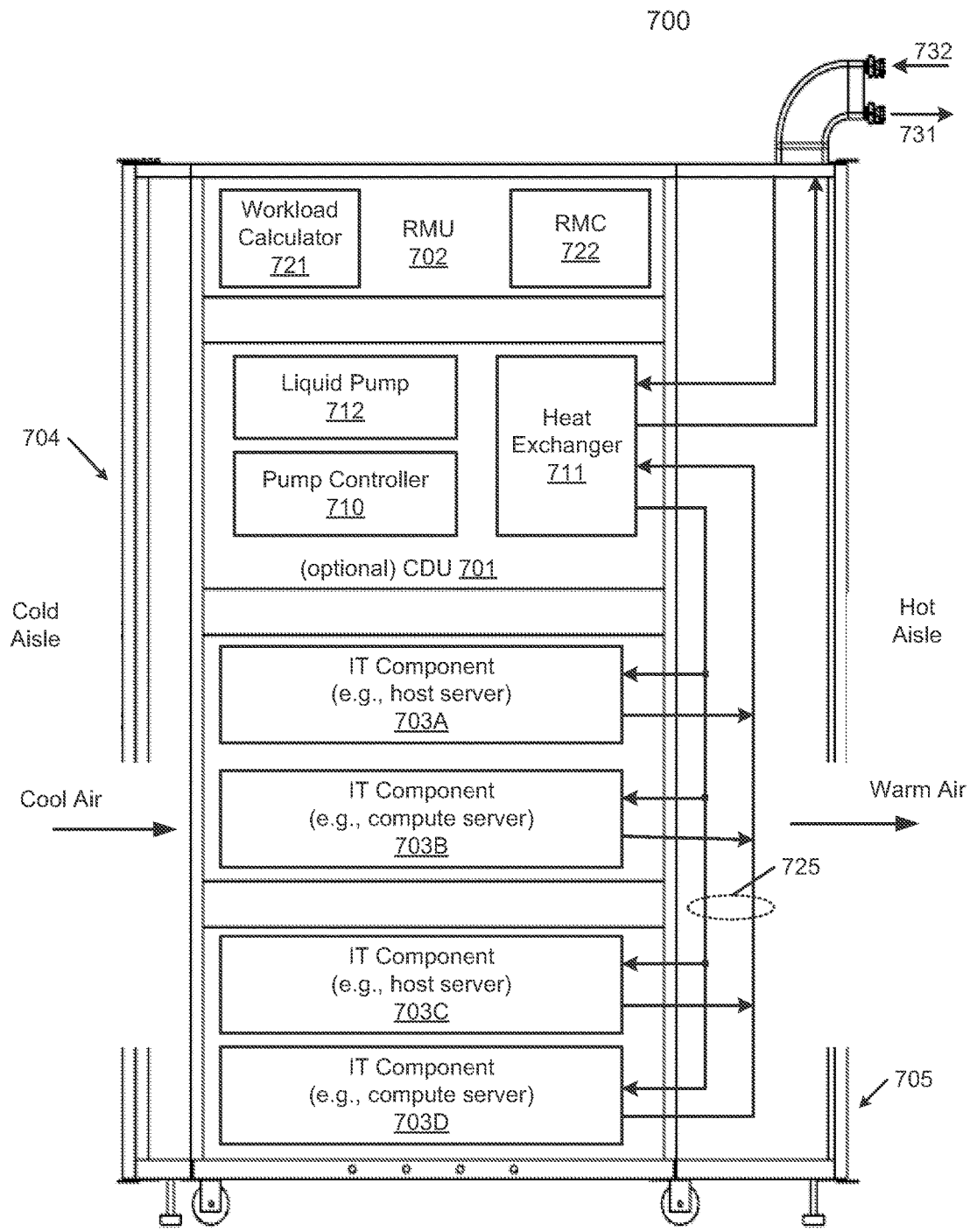
FIG. 8 is a block diagram illustrating a side view of an electronic rack according to one embodiment of the invention.

FIG. 8 is a block diagram illustrating a side view of an electronic rack according to one embodiment of the invention. Electronic rack 700 may represent any of the electronic racks of rows 101-104 of FIG. 1. Referring to FIG. 8, in one embodiment, electronic rack 700 includes CDU 701 (optional), rack management unit (RMU) 702, and one or more server blades 703A-703D, collectively referred to as server blades 703. Server blades 703 can be inserted into an array of server slots respectively from frontend 704 of electronic rack 700. Note that although there are only four server blades 703A-703D shown in FIG. 8, more or fewer server blades may be maintained within electronic rack 700. Also note that the particular positions of CDU 701 (optional), RMU 702, and server blades 703 are shown for the purpose of illustration only; other arrangements or configurations of CDU 701 (optional), RMU 702, and server blades 703 may also be implemented.

In one embodiment, CDU 701 mainly includes heat exchanger 711, liquid pump 712, liquid reservoir (not shown), and pump controller 710, some other components such as a reservoir, valve, CUD power supply, monitoring sensors and so on are not shown here. Heat exchanger 711 may be a liquid-to-liquid heat exchanger. Heat exchanger 711 includes a first loop with inlet and outlet ports having a first pair of liquid connectors coupled to external liquid supply/return lines 731-732 to form a primary loop, where the connectors coupled to the external liquid supply/return lines 731-732 may be disposed or mounted on backend 705 of electronic rack 700. The liquid supply/return lines 731-732 are coupled to a set of room manifolds as described above. In addition, heat exchanger 711 further includes a second loop with two ports having a second pair of liquid connectors coupled to liquid manifold 725, which may include a supply manifold to supply cooling liquid to server blades 703 and a return manifold to return warmer liquid back to CDU 701. Note that CDU 701 is referred to as a local CDU or rack mounted CDU, which is optional. In certain configuration, there may be no local CDU. In such a configuration the liquid supply and return lines 731-732 are directly coupled to a liquid distribution loop of each of server blades 703. Alternatively, CDU 701 may also provide cooling liquid to other electronic racks of the same row. Note that the overall structure and configuration of CDU 701 may represent any of the CDUs described above, such as CDUs 222. Note that CDUs 222 can be any kind of CDUs commercially available or customized ones. Thus, the details of CDUs 22 will not be described herein.

Each of server blades 703 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 703 may include a host server (referred to as a host node) coupled to one or more compute servers (also referred to as compute nodes, such as CPU server and CPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the high performance compute servers (having one or more GPUs) managed by the host server. The high performance compute servers perform the actual tasks, which may generate heat during the operations.

Electronic rack 700 farther includes RMU 702 configured to provide and manage power supplied to servers 703A-703D and CDU 701. RMU 702 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.,) to provide power to the rest of the components of electronic rack 700.

In one embodiment, RMU 702 includes workload calculator or calculation module 721 and rack management controller (RMC) 722. Workload calculator 721 is coupled to at least some of server blades 703 to receive workload information representing the workload of the server blades and to calculate the total workload of the server blades. Based on the total workload, RMC 722 is configured to send a signal or data to pump controller 710 of CDU 701, where the signal or data indicates the required workload of the server blades 703. As an example, based on the workload of server blades 703, pump controller 710 controls the speed of liquid pump 712, which in turn controls the liquid flow rate of cooling liquid supplied to the liquid manifold to be distributed to at least some of server blades 703.

Specifically, according to one embodiment, workload calculator 721 is coupled to each of the host servers to receive workload information from the host servers that distribute the tasks to one or more compute servers. The workload information may include information indicating the power (e.g., wattages) the compute servers will likely consume while performing the tasks. In one embodiment, the host servers communicate the workload information to workload calculator 721 prior to distributing the tasks to compute servers, such that the liquid flow rate is adjusted prior to the temperatures of the compute servers rise.

In addition, according to another embodiment, RMC 722 is also coupled to at least the compute servers to periodically or constantly monitor the operating temperatures of the compute servers and to dynamically further adjust the liquid flow rate of the heat removal liquid based on the operating temperatures. Each of the compute servers may include a thermal sensor to sense the operating temperature of one or more processors of the compute server. The thermal sensor may be directly attached to a body of the processor or a heat sink attached to the processor. Thus the temperature measured directly represents the temperature of the processor instead of the ambient temperature of the operating environment surrounding the server. The liquid flow rate of the heat removal liquid is adjusted based on the temperature of the processors, instead of the ambient temperature or the temperature of the return liquid.

In one embodiment, electronic rack 700 includes a first opening or inlet for cool air to flow in, and a second opening or outlet for warm/hot air to flow out of electronic rack 700. The first and second openings may be situated on the front, back of the electronic rack respectively. In another embodiment, the first and second openings may be situated on sides, top, or bottom of the electronic rack. In one embodiment, one or more fans may be mounted on the backend of the electronic rack to generate an air flow flowing from the frontend to the backend of the electronic rack. For example, one or more fans may be mounted on the back of at least some of the IT components 703A-703D.

In one embodiment, the liquid cooling system is configured to remove most of the heat generated by higher power consumption components of the server (e.g., CPUs, GPUs), while the air cooling system is configured to remove heat generated by lower power consumption components that are impractical or not feasibly removed by the liquid cooling system, such as, for example, memory, storage devices, motherboard, as well as the heat radiated from the higher power consumption components. By combining a liquid cooling system and an air cooling system, the individual fans normally mounted on the server blades or the electronic racks may not be needed, However, power supply units and/or network equipment of an electronic rack may still need to be fan cooled if necessary.

Note that the cooling techniques described above can be applied to a variety of different types of data centers, such as, for example, traditional colocation data centers, brown field data centers, and greenfield data centers. A colocation data center is a type of data center where equipment, space, and bandwidth are available for rental to retail customers. Colocation facilities provide space, power, cooling, and physical security tor the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may he performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may he performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center system, comprising:
a first row of electronic racks;
a second row of electronic racks positioned spaced apart from the first raw of electronic racks, forming an aisle between the first row and the second row of electronic racks; and
a coolant distribution unit (CDU) having a first set of a liquid supply line and a liquid return line coupled to a set of room manifolds arranged within the aisle, wherein the room manifolds are coupled to a set of rack manifolds of each of the electronic racks of the first row and the second row, wherein the rack manifolds of each of the electronic racks are adapted to receive a cooling liquid from the CDU via the set of room manifolds, to exchange heat generated from one or more information technology (IT) components of the electronic racks using the cooling liquid, and to return a warmer liquid carrying the exchanged heat back to the CDU.

2. The data center system of claim 1, wherein each of the electronic racks of the first row includes a first cooling fan to generate a first air flow that flows from a far side of the electronic rack, through an air space of the IT components, to a near side of the electronic rack, and into the aisle.

3. The data center system of claim 2, wherein each of the electronic racks of the second row includes a second cooling fan to generate a second air flow that flows from a far side of the electronic rack, through an air space of the IT components, to a near side of the electronic rack, and into the aisle.

4. The data center system of claim 2, wherein the first cooling fan is mounted on a near side of each electronic rack of the first row with respect to the aisle.

5. The data center system of claim 2, wherein the near side of an electronic rack represents a backend of the electronic rack, and wherein the far side of the electronic rack represents a frontend of the electronic rack.

6. The data center system of claim 5, wherein the rack manifolds of each electronic rack are disposed on the backend of the electronic rack.

7. The data center system of claim 1, wherein the CDU is positioned in a CDU slot within one of the electronic racks of the first row or second row.

8. The data center system of claim 1, wherein the CDU comprises:
   a first CDU disposed within one of the electronic racks of the first row, wherein the first CDU is coupled to the rack manifolds of each of the electronic racks of the first row; and
   a second CDU disposed within one of the electronic racks of the second row, wherein the second CDU is coupled to the rack manifolds of each of the electronic racks of the second row.

9. The data center system of claim 1, wherein the CDU comprises a heat exchanger and a second set of a liquid supply line and a liquid return line, wherein the second set of the liquid supply line and the liquid return line are coupled to a set of facility manifolds that are coupled to a facility cooling system that provides cooling liquid to a plurality of data center systems.

10. The data center system of claim 9, wherein the facility manifolds are disposed near a ceiling of a housing that houses the plurality of data center systems.

11. The data center system of claim 1, wherein the aisle is contained in an enclosure, and wherein the room manifolds of the CDU are contained within the enclosure.

12. The data center system of claim 11, wherein the enclosure is formed in a tunnel having a first side and a second side attached to the first row and second row of electronic racks, respectively.

13. The data center system of claim 12, wherein the first side includes a plurality of first openings, each to receive a backend of one of the electronic racks of the first row, and wherein the second side includes a plurality of second openings, each to receive a backend of one of the electronic racks of the second row.

14. A data center facility, comprising:
   a facility cooling system coupled to a set of facility manifolds; and
   a plurality of data center system, each data center systems comprises
   a first row of electronic racks, and
   a second row of electronic racks positioned spaced apart from the first row of electronic racks, forming an aisle between the first row and the second row of electronic racks; and
   a coolant distribution unit (CDU) having a first set and a second set of liquid supply lines and liquid return lines, wherein the first set of liquid supply line and liquid return line are coupled to the facility manifolds, wherein the second set of liquid supply line and the liquid return line are coupled to a set of room manifolds arranged within the aisle, wherein the room manifolds are coupled to a set of rack manifolds of each of the electronic racks of the first row and the second row, wherein the rack manifolds of each of the electronic racks are adapted to receive a cooling liquid from the CDU via the set of room manifolds, to exchange heat generated from one or more information technology (IT) components of the electronic racks using the cooling liquid, and to return a warmer liquid carrying the exchanged heat back to the CDU.

15. The data center facility of claim 14, wherein each of the electronic racks of the first row includes a first cooling fan to generate a first air flow that flows from a far side of the electronic rack, through an air space of the IT components, to a near side of the electronic rack, and into the aisle.

16. The data center facility of claim 15, wherein each of the electronic racks of the second row includes a second cooling fan to generate a second air flow that flows from a far side of the electronic rack, through an air space of the IT components, to a near side of the electronic rack, and into the aisle.

17. The data center facility of claim 15, wherein the first cooling fan is mounted on a near side of each electronic rack of the first row with respect to the aisle.

18. The data center facility of claim 15, wherein the near side of an electronic rack represents a backend of the electronic rack, and wherein the far side of the electronic rack represents a frontend of the electronic rack.

19. The data center facility of claim 18. wherein the rack manifolds of each electronic rack are disposed on the backend of the electronic rack.

20. The data center facility of claim 14, wherein the CDU is positioned in a CDU slot within one of the electronic racks of the first row or second row.

* * * * *